(12) United States Patent
Park et al.

(10) Patent No.: US 10,422,837 B2
(45) Date of Patent: Sep. 24, 2019

(54) METHOD AND APPARATUS FOR ESTIMATING STATE OF BATTERY

(71) Applicant: SAMSUNG ELECTRONICS CO., LTD., Suwon-si (KR)

(72) Inventors: SangDo Park, Seoul (KR); Kaeweon You, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 210 days.

(21) Appl. No.: 15/007,861

(22) Filed: Jan. 27, 2016

(65) Prior Publication Data
US 2016/0363632 A1    Dec. 15, 2016

(30) Foreign Application Priority Data

Jun. 11, 2015 (KR) .................. 10-2015-0082555

(51) Int. Cl.
| | | |
|---|---|---|
| *G01R 31/396* | (2019.01) | |
| *G01R 31/367* | (2019.01) | |
| *G01R 31/36* | (2019.01) | |

(52) U.S. Cl.
CPC ......... *G01R 31/396* (2019.01); *G01R 31/367* (2019.01); *G01R 31/3648* (2013.01)

(58) Field of Classification Search
None
See application file for complete search history.

(56) References Cited

U.S. PATENT DOCUMENTS

| | | | | |
|---|---|---|---|---|
| 5,541,489 | A | * | 7/1996 | Dunstan ............ G01R 31/3624 320/134 |
| 2009/0139781 | A1 | * | 6/2009 | Straubel ............ B60L 11/1875 180/65.1 |
| 2009/0189613 | A1 | | 7/2009 | Plett |
| 2010/0121511 | A1 | | 5/2010 | Onnerud et al. |
| 2012/0229099 | A1 | * | 9/2012 | Rossel .................. H02J 7/0016 320/162 |
| 2012/0290234 | A1 | * | 11/2012 | Schaefer ............ G01R 31/3624 702/63 |
| 2013/0320772 | A1 | * | 12/2013 | Qiao ..................... H01M 10/04 307/87 |

(Continued)

FOREIGN PATENT DOCUMENTS

| | | |
|---|---|---|
| KR | 10-0778440 B1 | 11/2007 |
| KR | 10-1021745 B1 | 3/2011 |

(Continued)

OTHER PUBLICATIONS

Extended European Search Report dated Nov. 24, 2016 in counterpart European Application No. 16165050.2. (7 pages in English).

(Continued)

*Primary Examiner* — James G Norman
(74) *Attorney, Agent, or Firm* — NSIP Law

(57) ABSTRACT

An apparatus for estimating a state of a battery including a data receiver configured to receive module data associated with a battery module included in a battery pack from the battery module, and a processor configured to acquire cell data corresponding to a battery cell included in the battery module from the module data, and determine a module state of the battery module based on the cell data.

19 Claims, 10 Drawing Sheets

(56) References Cited

U.S. PATENT DOCUMENTS

| | | | |
|---|---|---|---|
| 2014/0199569 A1* | 7/2014 | Sisk | B60L 3/0046 |
| | | | 429/91 |
| 2014/0229129 A1 | 8/2014 | Campbell et al. | |
| 2015/0280294 A1* | 10/2015 | Shin | H01M 10/625 |
| | | | 429/50 |
| 2015/0369874 A1 | 12/2015 | Park et al. | |

FOREIGN PATENT DOCUMENTS

| | | |
|---|---|---|
| KR | 10-2011-0129529 A | 12/2011 |
| KR | 10-2012-0096278 A | 8/2012 |
| WO | WO 2014/059050 A1 | 4/2014 |
| WO | WO 2014/191794 A1 | 12/2014 |

OTHER PUBLICATIONS

Kim, J. H., et al "The State of Charge Estimation of Li-Ion Battery Pack Based on Screening Process." *The Korean institute of Power Electronics* (2010). (3 pages, with English abstract).

Camci, Fatih, et al. "Sampling based State of Health estimation methodology for Li-ion batteries." *Journal of Power Sources* 278 (2015): 668-674. (7 pages, in English).

* cited by examiner

METHOD AND APPARATUS FOR ESTIMATING STATE OF BATTERY

CROSS-REFERENCE TO RELATED APPLICATION(S)

This application claims the benefit under 35 USC 119(a) of Korean Patent Application No. 10-2015-0082555 filed on Jun. 11, 2015, in the Korean Intellectual Property Office, the entire disclosure of which is incorporated herein by reference for all purposes.

BACKGROUND

1. Field

The following description relates to a method and an apparatus for estimating a state of a battery.

2. Description of Related Art

Many electronic devices include batteries, for example secondary batteries, that are repeatedly charged during operation of the electronic devices. As a number of times a secondary battery is discharged and recharged increases, a capacity of the secondary battery gradually decreases. With each charge cycle, a life of a battery of an electronic device decreases. Due to the decrease in the life of the battery, an initial battery capacity can no longer be attained after a large number of charging cycles. With a continual reduction in a capacity of a battery, a power, an operating time, and stability of the electronic device may become compromised. Accordingly, the battery may need to be replaced with a replacement battery.

To determine an estimated time to replace the battery, a state of health (SOH) of the battery may be estimated.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an apparatus for estimating a state of a battery includes a data receiver configured to receive module data associated with a battery module included in a battery pack from the battery module; and a processor configured to acquire cell data corresponding to a battery cell included in the battery module from the module data, and determine a module state of the battery module based on the cell data.

The processor may be further configured to determine a pack state of the battery pack based on the module state.

The battery pack may include a plurality of battery modules; and the processor may be further configured to calculate a statistical value of respective module states of the plurality of battery modules, and determine the pack state based on the statistical value.

The battery pack may be mounted in an electric vehicle (EV); and the processor may be further configured to calculate a minimum value of the module states of the plurality of battery modules, and determine the pack state based on the minimum value.

The apparatus may further include a data transmitter configured to transmit either one or both of the module state and the pack state to an external device.

The battery module may include a plurality of battery cells connected in parallel with each other; and the processor may be further configured to acquire the cell data by converting the module data to the cell data based on a number of the battery cells connected in parallel with each other.

The module data may include a value of a voltage signal output from the battery module, a value of a current signal output from the battery module, and a value of a temperature signal output from the battery module; and the processor may be further configured to acquire the cell data by maintaining the value of the voltage signal and the value of the temperature signal, and dividing the value of the current signal by the number of the battery cells connected in parallel.

The apparatus may further include a preprocessor configured to preprocess the received module data, and provide the preprocessed module data to the processor.

The module data may include any one or any combination of any two or more of a voltage signal output from the battery module, a current signal output from the battery module, and a temperature signal output from the battery module.

The processor may be further configured to estimate a battery life of the battery pack based on the module state, and determine an amount of charge in the battery pack based on the estimated battery life.

The apparatus may further include a memory configured to store a battery degradation model obtained by modeling a degradation in a single battery cell; and the processor may be further configured to determine the module state based on the cell data using the battery degradation model.

The battery pack may include a plurality of battery modules connected in series with each other; and each of the plurality of battery modules may include a plurality of battery cells connected in parallel with each other.

In another general aspect, a method of estimating a state of a battery, the method includes receiving module data associated with a battery module included in a battery pack from the battery module; acquiring cell data corresponding to a battery cell included in the battery module from the module data; and determining a module state of the battery module based on the cell data.

The method may further include determining a pack state of the battery pack based on the module state.

The battery pack may include a plurality of battery modules; and the determining of the pack state may include calculating a statistical value of respective module states of the plurality of battery modules; and determining the pack state based on the statistical value.

The battery module may include a plurality of battery cells connected in parallel with each other; and the acquiring of the cell data may include converting the module data to the cell data based on a number of the battery cells connected in parallel with each other.

In another general aspect, a non-transitory computer-readable storage medium stores instructions to cause computing hardware to perform the method described above.

In another general aspect, an apparatus for estimating a state of a battery pack having an nSmP structure, n and m being integers equal to or greater than "1," includes a data receiver configured to receive module data associated with each of a plurality of battery modules having a 1SmP structure from the battery pack; and a processor configured to acquire cell data corresponding to each of the battery modules based on the module data, and estimate the state of the battery pack based on the cell data.

The processor may be further configured to estimate respective module states of the battery modules based on the cell data, and determine the state of the battery pack based on the estimated module states.

Each of the battery modules may include a number m battery cells connected in parallel with each other; and the processor may be further configured to acquire the cell data by converting the module data to the cell data based on the number m of the battery cells connected in parallel with each other.

In another general aspect, an apparatus for estimating a state of a battery, the battery including battery cells, includes a simplifier configured to represent a portion of the battery including a plurality of battery cells as a single battery cell based on battery data of the portion of the battery; and an estimator configured to estimate a state of the battery based on a state of the single battery cell.

The battery may include a plurality of battery modules each including a plurality of battery cells; the simplifier may be further configured to represent the battery modules as respective single battery cells based on respective battery data of the battery modules; and the estimator may be further configured to estimate the state of the battery based on states of the single battery cells.

The plurality of battery modules may be connected in series with each other; the battery cells of each of the battery modules may be connected in parallel with each other; the simplifier may be further configured to convert the battery data of each of the battery modules into cell data of the respective single battery cell based on a number of the battery cells in the battery module; and the estimator may be further configured to estimate a state of each of the single battery cells based on the cell data of the single battery cells, and estimate the state of the battery based the states of the single battery cells.

The battery data of each of the modules may include an output voltage of the battery module, an output current of the battery module, and a temperature of the battery module; and the simplifier may be further configured to convert the battery data into the cell data by maintaining the output voltage and the temperature unchanged, and dividing the output current by the number of battery cells in the battery module.

The estimator may be further configured to estimate the state of the battery by applying the states of the single battery cells as inputs of a function, and estimate the state of the battery based on an output of the function.

The function may be a minimum function that outputs a minimum state among the states of the single battery cells, or a maximum function that outputs a maximum state among the states of the single battery cells, or a median function that outputs a middle state among the states of the single battery cells, or an average function that outputs an average state of the states of the single battery cells.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

The terminology used herein is for the purpose of describing particular examples only, and is not to limit the disclosure. As used herein, the singular forms "a", "an", and "the" are intended to include the plural forms as well, unless the context clearly indicates otherwise. As used herein, the terms "include," "comprise," and "have" specify the presence of stated features, numbers, operations, elements, components, and combinations thereof, but do not preclude the presence or addition of one or more other features, numbers, operations, elements, components, and combinations thereof.

Unless otherwise defined, all terms including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

Figure 1:
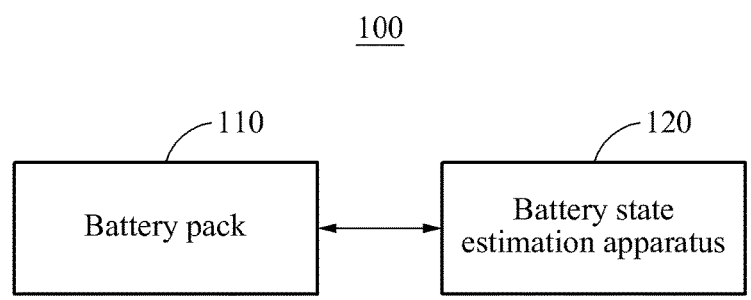
FIG. 1 illustrates an example of a configuration of a battery state estimation system.

FIG. 1 illustrates an example of a configuration of a battery state estimation system 100.

Referring to FIG. 1, the battery state estimation system 100 includes a battery pack 110 and a battery state estimation apparatus 120.

The battery pack 110 is charged with power and discharged to supply the power to a device. The device may be any electrical or electronic device including a battery, for example, an electric vehicle (EV), a hybrid vehicle, or an energy storage system (ESS). The battery pack 110 may be, for example, a battery including a plurality of battery cells. An example of the battery pack 110 will be further described with reference to FIG. 2 below.

The battery state estimation apparatus 120 estimates a state of the battery pack 110. In one example, the battery state estimation apparatus 120 is mounted in an electric device, for example an EV. In another example, when an electric device has a communication function, a remote management server separate from the electric device includes the battery state estimation apparatus 120, and the battery state estimation apparatus 120 remotely receives data of the battery pack 110 included in the electric device and estimates the state of the battery pack 110.

In a battery state estimation apparatus in related art, a battery cell is disconnected from a battery pack so that a state of the battery cell can be estimated, thereby reducing an available output of the battery pack for operation of an electric device. To compensate for this, the battery pack includes more cells than are normally needed for operation of the electric device, which increases the cost of the battery pack. Also, to estimate the state of the battery cell disconnected from the battery pack, a separate charger and a separate discharger are needed, which also increases costs. Furthermore, the battery cell disconnected from the battery pack has a different aging history than the other battery cells in the battery pack, which may cause an unbalance between the battery cells and reduce a performance of the battery pack. Another battery state estimation apparatus in related art uses a scheme of generating a learning model of a battery cell, but it is difficult to apply the scheme without a change due to a difference in characteristics between the battery cell and the battery pack. To directly generate a learning model of the battery pack, a large quantity of learning data is needed. In addition, when a configuration of the battery pack changes, a new learning process needs to be performed.

Unlike in the related art described above, the battery pack 110 does not need to include a battery cell having a capacity greater than a required capacity, and an additional high-cost device to measure the state of the battery pack 110 is not required. Also, battery management of an electric device is not hindered, and a large quantity of learning data does not need to be generated. An additional learning process is minimized despite a change in a configuration of the battery pack 110, and the battery state estimation apparatus 120 estimates the state of the battery pack 110.

In this application, state information associated with a state of a battery, a module state of a battery module, and a pack state of a battery pack includes, for example, information associated with a life of the battery, a life of the battery module, and a life of the battery pack. Information associated with the life of the battery includes, for example, a state of health (SOH), a state of charge (SOC), and a remaining useful life. The SOH may be represented as a ratio of a current battery capacity to an initial battery capacity, but is not limited thereto. Accordingly, the SOH may be represented using various schemes. In the following description, an SOH of each of the battery, the battery module, and the battery pack will be described as an example of each of the state, the module state, and the pack state, but the state is not limited thereto.

Figure 2:
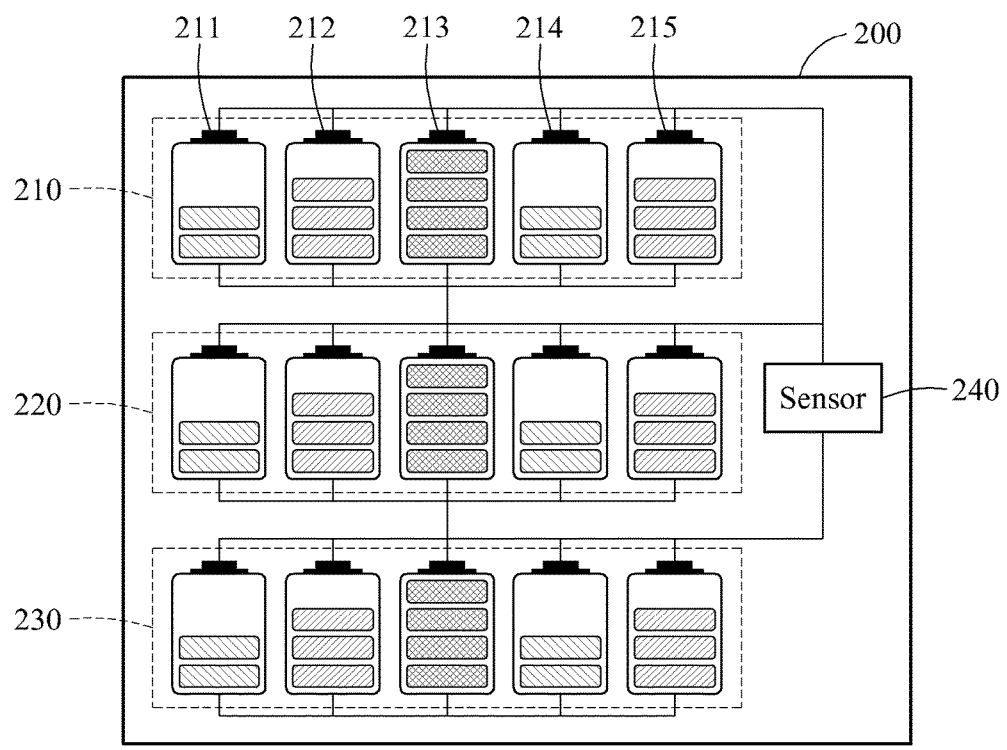
FIG. 2 illustrates an example of a configuration of a battery pack.

FIG. 2 illustrates an example of a configuration of a battery pack 200.

Referring to FIG. 2, the battery pack 200 includes a plurality of battery modules connected in series with each other. Each of the battery modules includes a plurality of battery cells connected in parallel with each other. The battery pack 200 has an nSmP structure.

In this application, the nSmP structure is a structure in which "n" battery modules are connected in series with each other, each of the "n" battery modules includes "m" battery cells connected in parallel with each other, and "n" and "m" are integers equal to or greater than "1." For example, referring to FIG. 2, in the battery pack 200, battery cells 211, 212, 213, 214, and 215 are connected in parallel with each other and are included in a battery module 210. Battery modules 220 and 230 have the same structure as the battery module 210. In addition, the three battery modules 210, 220, and 230 are connected in series with each other. In other words, the battery pack 200 has a 3S5P structure in which "n" is "3" and "m" is "5."

A sensor 240 measures module data associated with each of the battery modules. The sensor 240 may be located inside or outside the battery pack 200. In FIG. 2, a single sensor, that is, the sensor 240, is connected to the battery modules 210 through 230, and measures module data associated with each of the battery modules 210 through 230. However, more than one sensor 240 may be used. For example, when a plurality of sensors 240 are provided, each of the sensors 240 may measure module data associated with a different one of a plurality of battery modules. The module data is data associated with a battery module, and includes, for example, data on a temperature of the battery module, or a voltage signal and a current signal output from the battery module. The sensor 240 provides the measured module data to a battery state estimation apparatus.

For example, the sensor 240 measures module data associated with a battery module included in the battery pack 200 at least once per second at a sensing frequency of at least 1 hertz (Hz). A voltage, a current, and a temperature may be measured in volts, (V), amperes (A), and degrees Celsius (° C.) by the sensor 240.

Figure 3:
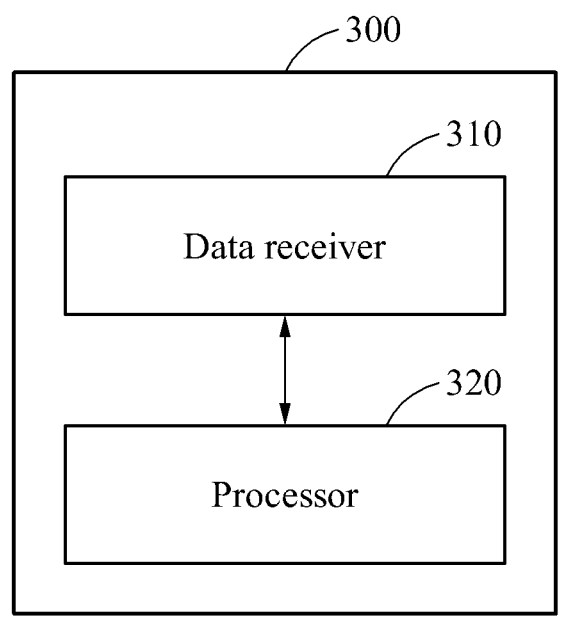
FIGS. 3 and 4 illustrate examples of a configuration of a battery state estimation apparatus.
Figure 4:
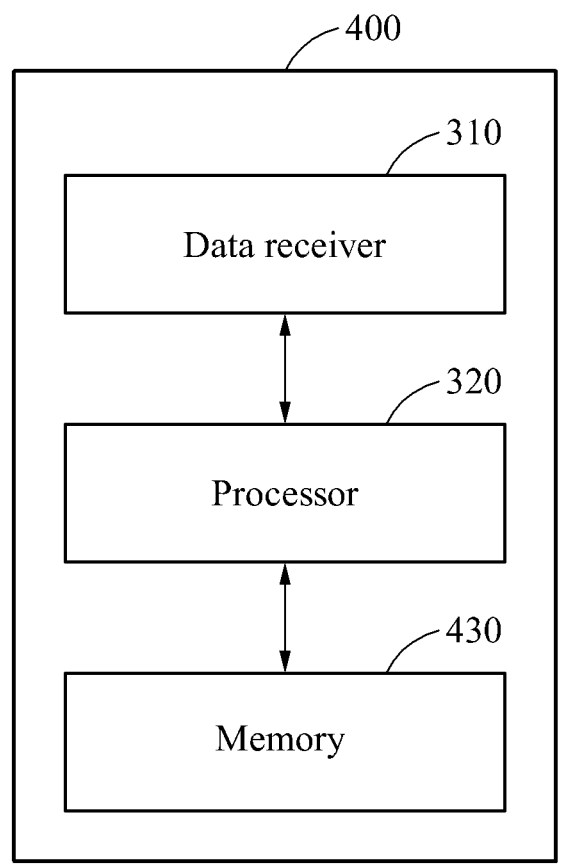

FIGS. 3 and 4 illustrate examples of a configuration of a battery state estimation apparatus.

Referring to FIG. 3, an example of a battery state estimation apparatus 300 includes a data receiver 310 and a processor 320.

The data receiver 310 receives module data associated with a battery module from the battery module. The battery module is included in a battery pack. For example, the data receiver 310 receives module data associated with each of a plurality of battery modules having a 1SmP structure from a battery pack having an nSmP structure. The data receiver 310 may directly receive the module data via a data interface from the battery pack, or may receive the module data wirelessly or via a wired connection using a communicator.

The processor 320 acquires cell data corresponding to a battery cell included in the battery module from the received module data, and determines a module state of the battery module based on the cell data. For example, the processor 320 acquires cell data corresponding to each of a plurality of battery modules having a 1SmP structure based on the received module data, and estimates a state of the battery pack based on the cell data.

The cell data is data corresponding to a battery cell included in a battery module. For example, when battery cells included in a battery module are assumed to have the same voltage, the same current, and the same temperature, a voltage and temperature of a battery cell included in the battery module is the same as a voltage and temperature of the battery module, a current of the battery cell is a current obtained by dividing a value of a current of the battery module by "m," and the cell data includes these values. In this example, m denotes a number of the battery cells in the battery module.

Referring to FIG. 4, another example of a battery state estimation apparatus 400 further includes a memory 430 compared to the battery state estimation apparatus 300 of FIG. 3. The memory 430 stores at least one program including instructions for performing a battery state estimation method. Also, the memory 430 stores a battery degradation model obtained by modeling a degradation in a single battery cell.

The battery degradation model includes, for example, a data-driven model or an equivalent circuit model.

The data-driven model is a model applicable to machine learning, and includes, for example, a model used to output a degree of degradation in a state of a battery (for example, a battery life or a malfunction) due to an arbitrary factor. The battery degradation model is, for example, a parameter of a machine learning structure. For example, when a neural network is used as a machine learning structure, the battery degradation model may be connection weights between nodes in the neural network. The battery degradation model may include a parameter of a trainer trained to output reference state information corresponding to reference battery information based on the reference battery information in a given machine learning structure. Training data used for a training operation of the trainer may include the reference state information and the reference battery information, and the reference state information may be, for example, information on a state of a battery with corresponding reference battery information in an existing profile.

The equivalent circuit model includes an equivalent equation. The equivalent equation is derived based on an equivalent circuit of a battery cell, and expresses a relationship between a state of a battery and cell data associated with the battery cell. A processor 320 of the battery state estimation apparatus 400 measures a voltage and a current of a battery cell based on an equivalent equation expressing a relationship between the voltage, the current, and a resistance of the battery cell, and estimates the resistance based on the measured voltage and the measured current.

Figure 5:
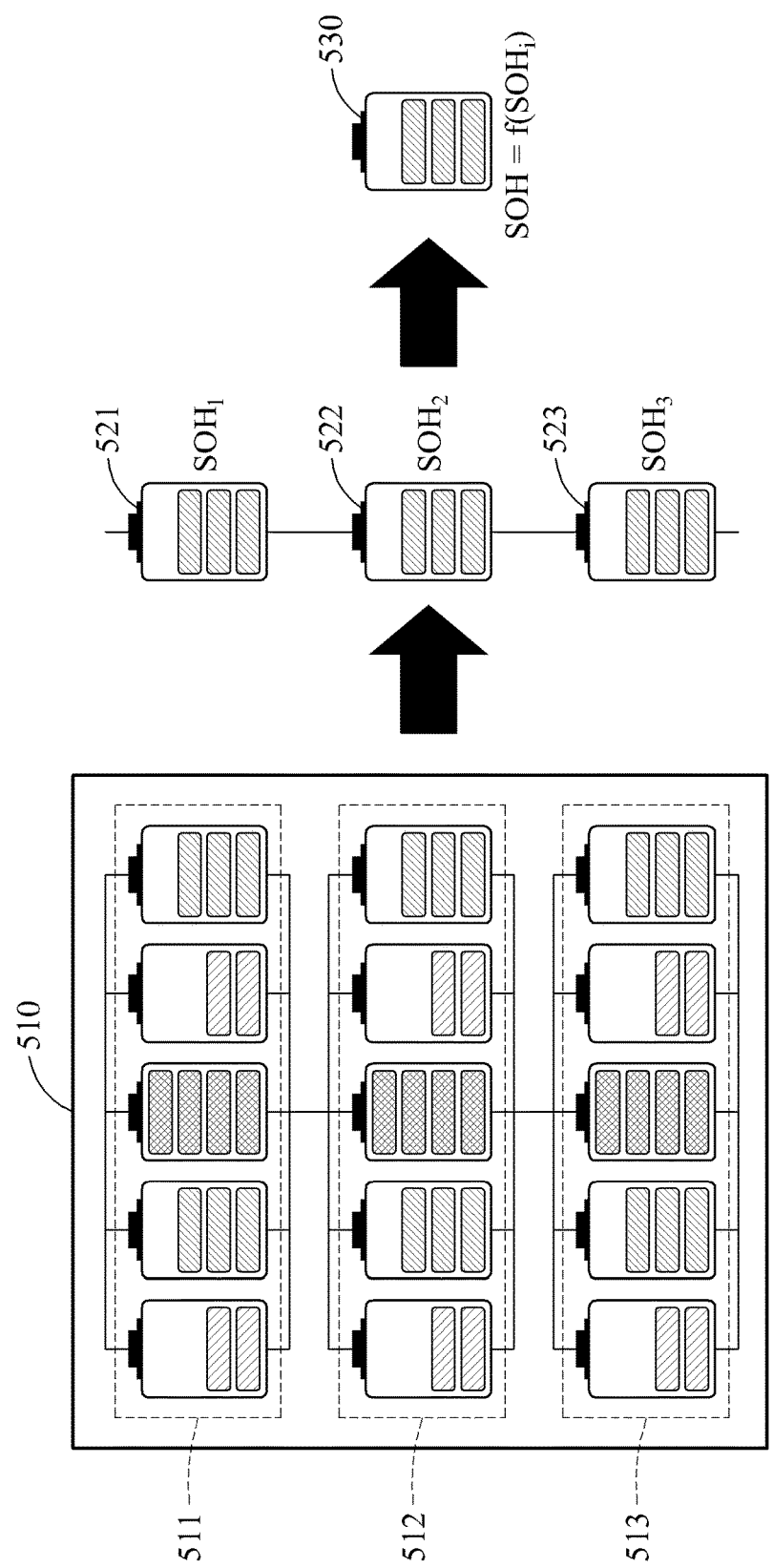
FIG. 5 illustrates an example of an overall process of estimating a state of a battery.

FIG. 5 illustrates an example of an overall process of estimating a state of a battery.

To estimate a pack state of a battery pack 510 in a unit of a cell, a battery state estimation apparatus converts an nSmP structure of the battery pack 510 to a single cell structure. The battery pack 510 includes a plurality of battery modules connected in series with each other, and each battery module includes a plurality of battery cells connected in parallel with each other. In FIG. 5, a number "m" of battery cells connected in parallel is "5," and a number "n" of battery modules connected in series is "3."

The battery state estimation apparatus converts or simplifies each of the battery modules to a battery cell corresponding to each of the battery modules. Because battery cells connected in parallel in a battery module have similar characteristics due to self-balancing, the battery state estimation apparatus converts a battery module in which "m" battery cells are connected in parallel with each other to a single battery cell, and estimates a state of the single battery cell. A state and cell data associated with the single battery cell (for example, a first battery cell 521, a second battery cell 522, and a third battery cell 523) are determined as a module state and module data associated with the battery module.

For example, the battery state estimation apparatus acquires cell data associated with the first battery cell 521 corresponding to a first battery module 511 from module data associated with the first battery module 511, estimates a state of the first battery cell 521 based on the cell data, and determines a module state of the first battery module 511 to be the state of the first battery cell 521. Similarly, by the same process, the battery state estimation apparatus simplifies a second battery module 512 and a third battery module 513 to a battery cell 522 and a battery cell 523, respectively, and determines a module state of the second battery module 512 to be a state of the battery cell 522 and a module state of the third battery module 513 to be a state of the battery cell 523.

The battery state estimation apparatus estimates the pack state of the battery pack 510 based on a module state determined based on cell data associated with a battery cell 530 obtained by simplifying and combining the first battery module 511, the second battery module 512, and the third battery module 513.

For example, the battery state estimation apparatus estimates a state of the battery cell 530 based on a module state of the battery module 511 determined based on the cell data associated with the first battery cell 521, a module state of the battery module 512 determined based on cell data associated with the second battery cell 522, and a module state of the battery module 513 determined based on cell data associated with the third battery cell 523. Also, the battery state estimation apparatus determines the state of the battery cell 530 as the pack state of the battery pack 510. As shown in FIG. 5, the state of the battery cell 530 is calculated using "SOH=f(SOH$_i$)" in which f denotes an arbitrary function and SOH$_i$ denotes a module state of an i-th battery module. For example, an output of the arbitrary function f is a statistical value of a module state, and the statistical value includes, for example, a minimum value, a median value, or a maximum value of inputs of the arbitrary function f.

In one example, the battery pack 510 including the plurality of battery cells is converted to a single battery cell, for example, the battery cell 530, and the pack state of the battery pack 510 is estimated based on the state of the single battery cell. In this example, in repeated experiments to estimate a state of a battery that is an analog device, an experiment on the battery pack 510 is simplified to an experiment on a cell unit, which may greatly reduce experimental costs. Also, damage to a low-capacity cell is minimized despite an occurrence of a fault, and, thus, a risk of the fault may be reduced. In addition, because an operation does not need to be performed on all of the battery cells in the battery pack 510, a complexity is reduced. Thus, an expensive processing device does not need to be mounted in an electronic device or the battery state estimation apparatus, thereby reducing costs.

In related art, a large amount of time and cost are needed to assemble a high-capacity battery pack and acquire data associated with the battery pack. However, the battery state estimation apparatus disclosed in this application estimates the pack state of the battery pack 510 by converting the battery pack 510 to the battery cell 530, and thus various battery degradation models may be utilized. Also, despite a change in a structure of the battery pack 510, a battery degradation model corresponding to the battery cell 530 may be updated by performing a few experiments, or an additional experiment may not need to be performed. Thus, it is possible to estimate the pack state of the battery pack 510.

Figure 6:
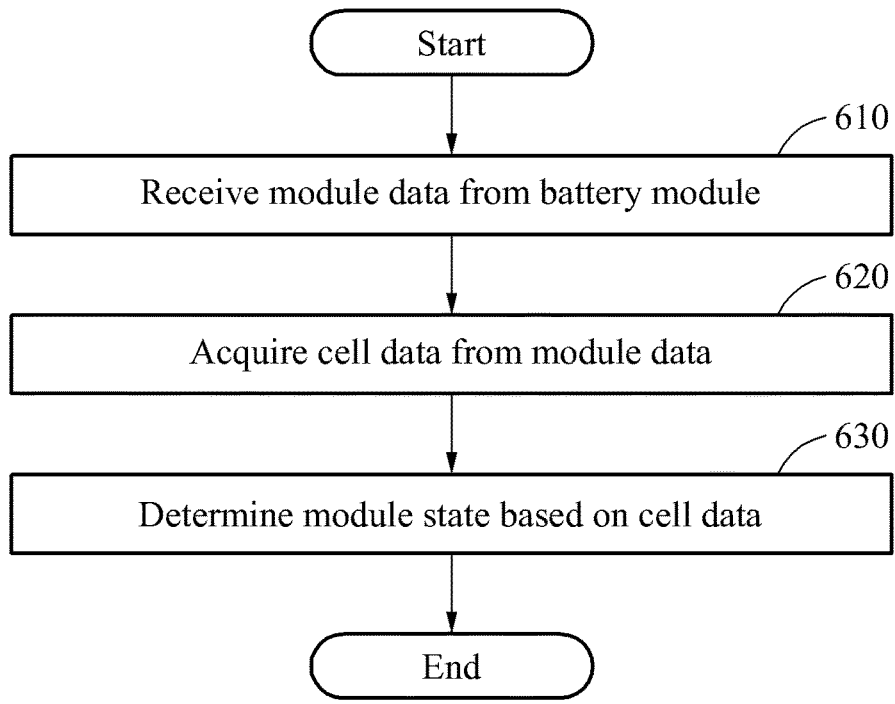
FIG. 6 illustrates an example of a battery state estimation method.

FIG. 6 illustrates an example of a battery state estimation method.

Referring to FIG. 6, in operation 610, a data receiver of a battery state estimation apparatus receives module data associated with a battery module included in a battery pack from the battery module. For example, a sensor mounted in the battery pack periodically transmits measured module data to the battery state estimation apparatus, and the battery state estimation apparatus receives the module data.

In operation 620, the battery state estimation apparatus acquires cell data from the module data. The cell data is data corresponding to a battery cell included in the battery module. The battery state estimation apparatus acquires the cell data by scaling down the module data to a unit of a cell. The cell data may be, for example, data associated with a battery cell having an equivalent relationship with a battery module having a 1S1P structure obtained by simplifying a battery module having a 1SmP structure.

For example, the battery state estimation apparatus converts the module data to cell data based on a number of battery cells connected in parallel with each other in the battery module. The battery state estimation apparatus maintains a value of a voltage signal and a value of a temperature signal among the module data, and divides a value of a current signal by the number of the battery cells to acquire the cell data.

In operation 630, the battery state estimation apparatus determines a module state of a battery module based on the cell data. For example, the battery state estimation apparatus determines the module state based on the cell data using a battery degradation model of a single battery cell. The battery state estimation apparatus inputs the cell data to the battery degradation model, and determines, as the module state, a state (for example, an SOH) output from the battery degradation model to which the cell data is input. The cell data includes, for example, a voltage, a current, and a temperature of a battery cell corresponding to the battery module. Also, the battery state estimation apparatus estimates a battery life (for example, an SOH) of the battery pack based on the module state, and determines an amount of charge in the battery pack (for example, an SOC) based on the estimated battery life. The amount of charge in the battery pack is provided as a module state.

Figure 7:
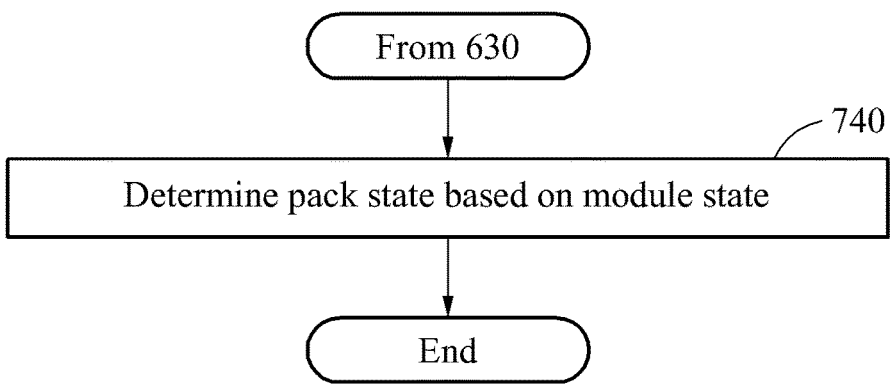
FIG. 7 illustrates an example of an operation of determining a pack state of a battery pack in the battery state estimation method of FIG. 6.

FIG. 7 illustrates an example of an operation of determining a pack state of the battery pack in the battery state estimation method of FIG. 6.

Referring to FIG. 7, in operation 740, the battery state estimation apparatus determines the pack state of the battery pack based on the module state determined in operation 630 of FIG. 6. For example, the battery state estimation apparatus estimates the pack state based on a module state of each of a plurality of battery modules connected in series in the battery pack. The pack state and the module state may be, for example, an SOH of the battery pack and an SOH of each of the battery modules, respectively.

The battery state estimation apparatus calculates a statistical value of a module state of each of the plurality of battery modules in the battery pack, and determines the pack state to be the statistical value. In one example in which the battery pack is in an EV, the battery state estimation apparatus calculates a minimum value of module states of the battery modules as the pack state. In another example in which the battery pack is in a hybrid vehicle, the battery state estimation apparatus calculates a maximum value of the module states as the pack state. In another example in which the battery pack is in an ESS, the battery state estimation apparatus calculates an median value of the module states as the pack state. However, the statistical value is not limited to the minimum value, the maximum value, and the median value. For example, an average value may also be used as a statistical value. In addition, various linear combinations or nonlinear combinations of the module states may be used depending on an application of the battery pack.

Figure 8:
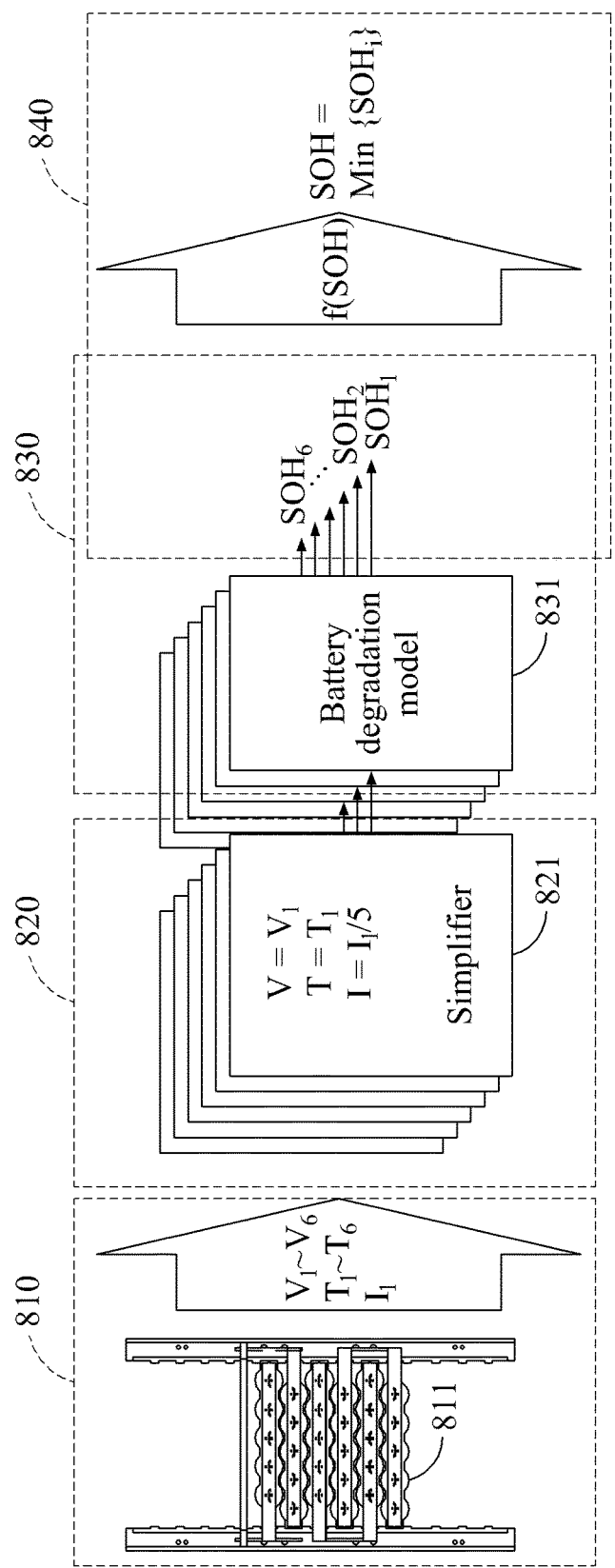
FIG. 8 illustrates an example of a battery state estimation process.

FIG. 8 illustrates an example of a battery state estimation process.

Referring to FIG. 8, a battery pack 811 has an nSmP structure (for example, a 6S5P structure in FIG. 8) and includes "n×m" battery cells (for example, 6×5=30 battery cells in FIG. 8). In the battery pack 811, "n" battery modules (for example, six battery modules in FIG. 8) having a 1SmP structure (for example, a 1S5P structure in FIG. 8) are connected in series.

In operation 810, a battery state estimation apparatus receives module data from the battery pack 811. The battery state estimation apparatus receives voltage signals $V_1$ through $V_6$, temperature signals $T_1$ through $T_6$, and a current signal $I_1$ from the six battery modules. Because the six battery modules are connected in series with each other, the current signals of the six battery modules have the same value $I_1$, and the voltage signals $V_1$ through $V_6$, and the temperature signals $T_1$ through $T_6$ may be the same as or different from each other depending on a state of each of the six battery modules.

In operation 820, the battery state estimation apparatus simplifies each of the battery modules to a single battery cell. For example, the battery state estimation apparatus converts module data associated with battery modules having a 1SmP structure based on a number "m" of battery cells connected in parallel with each other in each of the battery modules to acquire cell data associated with a battery cell obtained by simplifying each of the battery modules. In this example, "m" is an integer equal to or greater than "1."

Battery cells included in a battery module having a 1S5P structure have the same voltage value because the battery cells are connected in parallel with each other, which make it easy to measure the voltage value for each of the battery cells. The battery cells have different current values due to different internal resistances of the battery cells. However, to measure current values for each of the battery cells, a cost and a complexity of the overall structure would increase. Accordingly, in one example, it is assumed that the battery state estimation apparatus measures the current of the battery module, and that the battery cells connected in parallel with each other in the battery module have the same current value due to a self-balancing effect. For example, referring to FIG. 8, a value of a voltage V and a value of a temperature T of a first battery cell 821 obtained by simplifying a first battery module among the six battery modules are determined to be $V_1$ and $T_1$ of the first battery module, respectively, and a value of a current I of the first battery cell 821 is calculated as a value of $I_1/5$" obtained by dividing a value of the current, that is $I_1$, of the first battery module by "5," which is a number of battery cells included in the first battery module. In FIG. 8, cell data associated with the first battery cell 821 includes the voltage V, the current I, and the temperature T.

In operation 830, the battery state estimation apparatus estimates a module state of each of the battery modules having the 1SmP structure based on the cell data using a battery degradation model 831. Each of the battery modules having the 1S5P structure includes five battery cells having the same voltage, the same current, and the same temperature. The battery state estimation apparatus estimates a state of a battery cell (for example, an SOC or an SOH) using the battery degradation model 831. The battery degradation model 831 is used to estimate a module state of each of the six battery modules connected in series in the battery pack 811. The module states include, for example, $SOH_1$ and $SOH_2$ through $SOH_6$ as shown in FIG. 8. Although FIG. 8 illustrates six battery degradation models 831 respectively corresponding to the six battery modules, a single battery degradation model 831 may be used and the battery degradation models 831 may include the same parameter. However, the battery state estimation apparatus is not limited thereto, and the battery state estimation apparatus may estimate a plurality of module states of the same battery module by applying various battery degradation models to the same battery module, and may derive a single module state based on a statistical value, a selection, or filtering of the plurality of module states.

In operation 840, the battery state estimation apparatus estimates a pack state of the battery pack 811 based on the module state estimated in operation 830. For example, module states (for example, $SOH_1$ through $SOH_6$) of battery modules may have the same value or different values, and the battery state estimation apparatus may estimate the pack state by applying the module states to an arbitrary function f. In FIG. 8, the function f is set to be a MIN function to output a minimum value among inputs of the function f, and the battery state estimation apparatus determines a minimum value among $SOH_1$ through $SOH_6$ as an SOH of the battery pack 811. However, this is merely an example, and the function f may be set to output another statistical value, such as, for example, a maximum value, a median value, or an average value.

Figure 9:
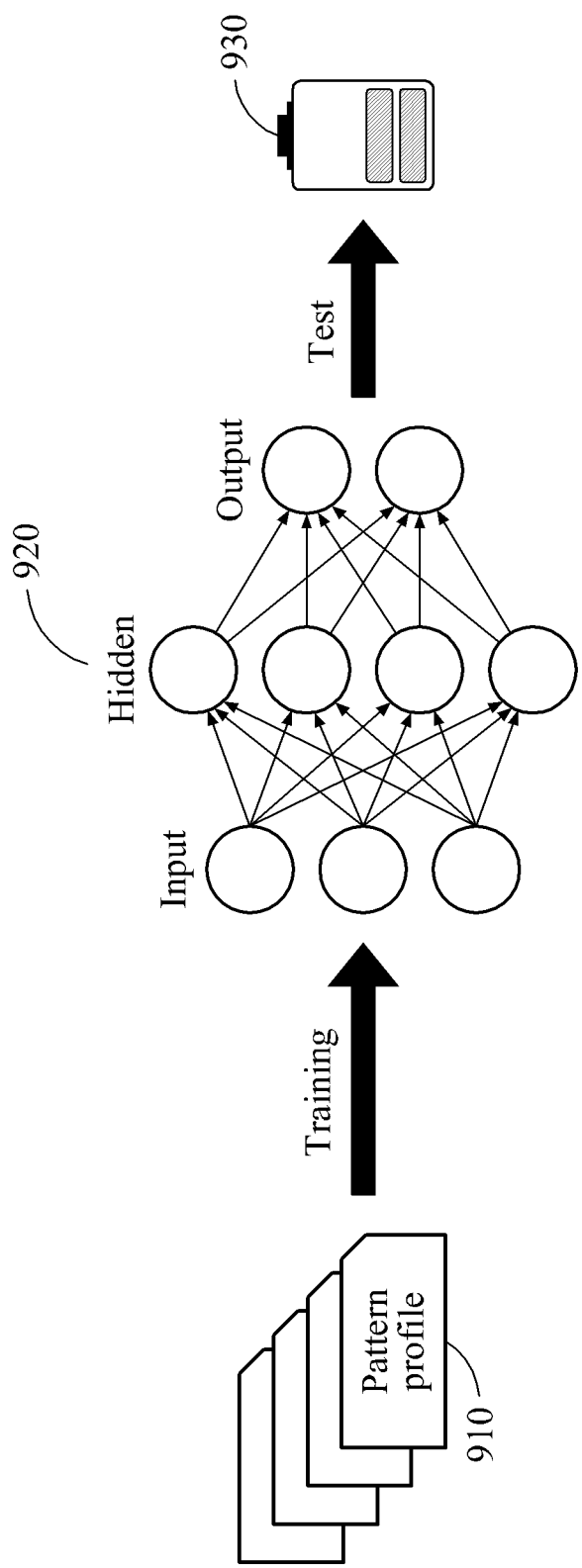
FIG. 9 illustrates an example of a process of estimating a module state of a battery module.

FIG. 9 illustrates an example of a process of estimating a module state of a battery module.

In one example, a machine learning model is used as a battery degradation model. The machine learning model is, for example, a neural network 920, and includes an input layer, a hidden layer, and an output layer. Nodes in each of layers are connected to each other with a learned connection weight.

A trainer (not shown) is used to train the neural network 920 using training data including a plurality of pattern profiles 910. Each of the pattern profiles 910 includes, for example, a voltage, a current, a temperature, and a life of a battery. The voltage, the current, and the temperature are measured in advance during a simulation or use of the battery. The trainer is used to train the neural network 920 using the pattern profiles 910 so that a preset battery life is output in response to inputs (for example, a voltage, a current, and a temperature set in advance in the pattern profiles 910) to the battery degradation model.

The battery state estimation apparatus estimates a state of a battery cell included in a battery module from cell data associated with a battery cell 930 using the trained neural network 920. The battery cell 930 is obtained by simplifying the battery module as described above with reference to FIGS. 1 through 8. The state of the battery cell corresponds to a module state.

Figure 10:
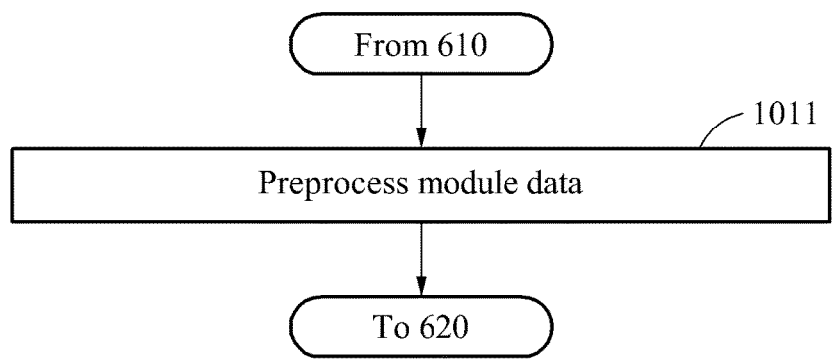
FIG. 10 illustrates an example of an operation of preprocessing module data in the battery state estimation method of FIG. 6.

FIG. 10 illustrates an example of an operation of preprocessing the module data in the battery state estimation method of FIG. 6.

Referring to FIG. 10, in operation 1011, a preprocessor of the battery state estimation apparatus preprocesses the module data received from the sensor in the battery module in operation 610 of FIG. 6. The preprocessor performs filtering, for example low-pass filtering, on the module data to remove noise from the module data. The preprocessor removes unnecessary noise components by performing filtering at a frequency twice a sampling rate at which the sensor samples the module data.

Figure 11:
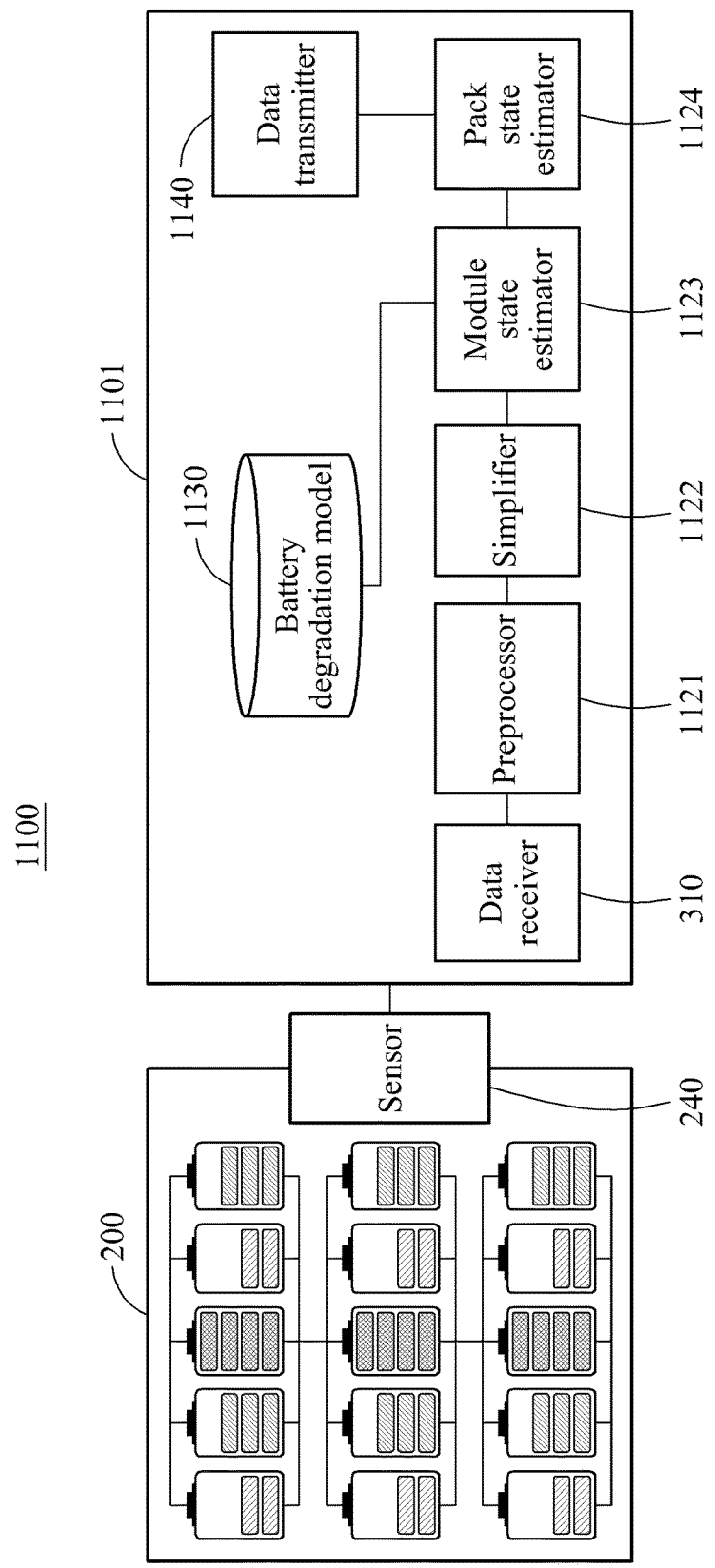
FIG. 11 illustrates another example of a configuration of a battery state estimation system.

FIG. 11 illustrates another example of a battery state estimation system 1100.

Referring to FIG. 11, the battery state estimation system 1100 includes a battery pack 200 and a battery state estimation apparatus 1101.

The above description of the battery pack 200 of FIG. 2 is also applicable to the battery pack 200 of FIG. 11, and accordingly will not be repeated here. A sensor 240 of FIG. 11 may be located inside or outside the battery pack 200 as described above with reference to FIG. 2.

The battery state estimation apparatus 1101 includes a data receiver 310, a preprocessor 1121, a simplifier 1122, a module state estimator 1123, a pack state estimator 1124, a battery degradation model 1130, and a data transmitter 1140.

The data receiver 310 receives data from the sensor 240 attached to the battery pack 200 as described above with reference to FIG. 3.

The preprocessor 1121 preprocesses the received module data as described above with reference to FIG. 10, and provides the preprocessed module data to a processor (for example, the processor 320 of FIG. 3 or 4) or the simplifier 1122. For example, the preprocessor 1121 filters out noise from the module data or converts a data type of the module data, but the preprocessor 1121 is not limited thereto.

The simplifier 1122 converts battery modules, each having battery cells connected in parallel, in the battery pack 200 to an equivalent model of a single battery cell. The simplifier 1122 maintains a voltage value and a temperature value of a battery module as a voltage and a temperature of the single battery cell corresponding to the equivalent model obtained by simplifying the battery module, and uses, as a current of the single battery cell, a value obtained by dividing a current value of the battery module by a number of battery cells included in the battery module. A value output from the simplifier 1122 corresponds to cell data to which the module data is converted in a unit of a cell.

The module state estimator 1123 estimates a state of the single battery cell obtained by simplifying the battery module. For example, to estimate a module state of the battery module, the module state estimator 1123 uses an equivalent circuit model, a data-driven model, or a coulomb counting scheme. The module state estimator 1123 estimates, as a module state, a battery life (for example, an SOH) or an amount of charge in a battery (for example, an SOC).

The pack state estimator 1124 determines a pack state of the battery pack 200 by combining module states of battery modules connected in series. In an EV, in response to the module state estimator 1123 estimating a battery life or an amount of charge in a battery, the pack state estimator 1124 determines a minimum value of the battery life or the amount of charge of the battery modules as the pack state of the battery pack 200. In a hybrid vehicle (for example, a hybrid EV (HEV)), in response to the module state estimator 1123 estimating an amount of charge in a battery (for example, an SOC), the pack state estimator 1124 determines a sum of amounts of charge in battery modules as the pack state of the battery pack 200, because a maximum power of the battery is important in the hybrid vehicle. The sum may be, for example, a sum of SOC values of the battery modules.

The battery degradation model 1130 is obtained by modeling a degradation in the single battery cell. The battery degradation model 1130 is stored in, for example, the memory 430 of FIG. 4.

The data transmitter 1140 transmits either one or both of the module state and the pack state to a module included in the battery state estimation apparatus 1101, or transmits either one or both of the module state and the pack state to an external device.

In one example, when the battery state estimation apparatus 1101 is mounted in an electric device, for example, an EV, the pack state may be easily estimated based on data generated during an operation of the electric device, instead of using a separate power supply device to estimate the pack state.

The preprocessor 1121, the simplifier 1122, the module state estimator 1123, and the pack state estimator 1124 may be implemented by, for example, the processor 320 of FIG. 3.

Figure 12:
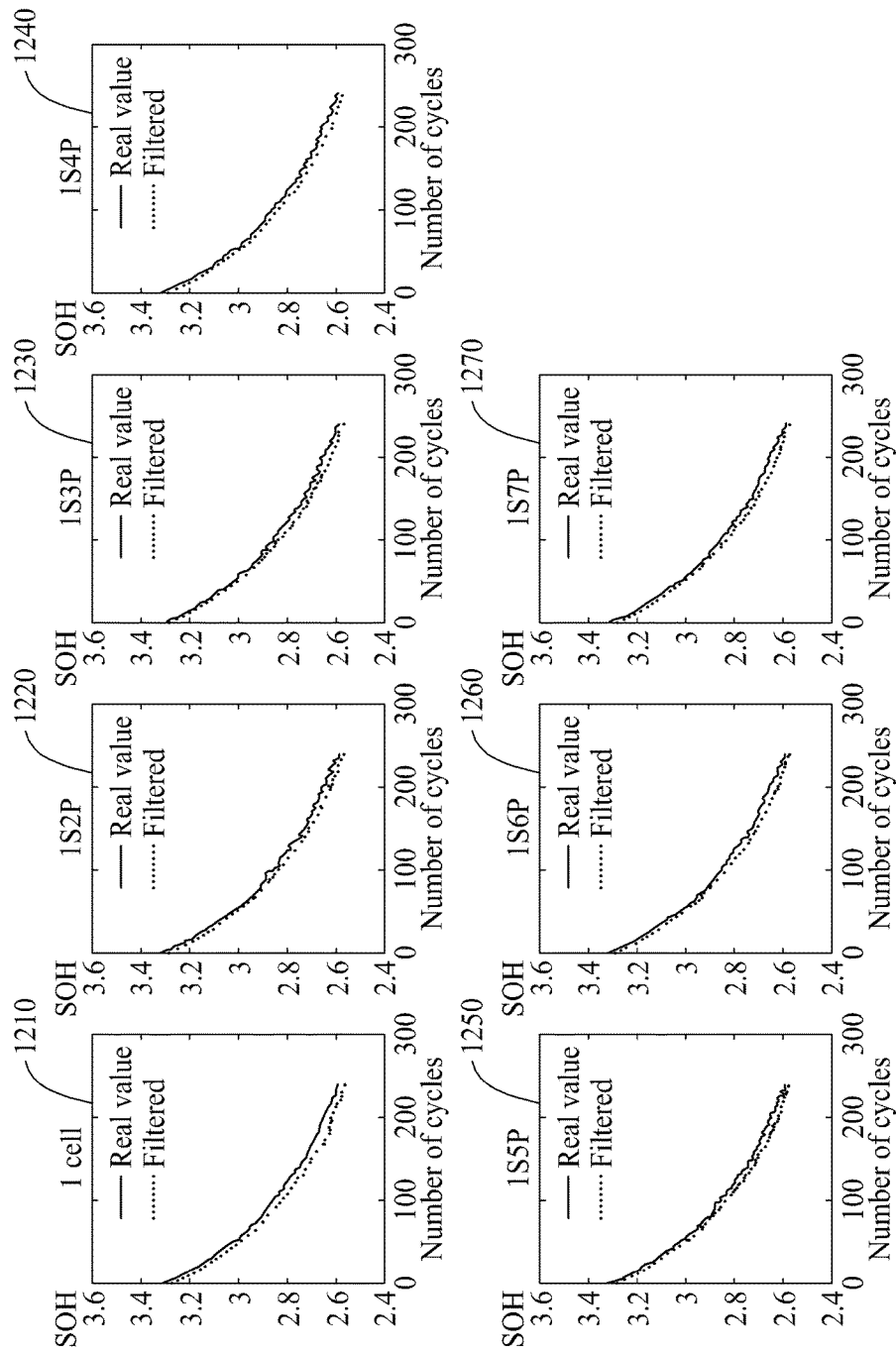
FIG. 12 illustrates examples of an accuracy of a battery state estimation.

FIG. 12 illustrates examples of an accuracy of a battery state estimation.

In FIG. 12, a graph 1210 shows a comparison between a real value of a single battery cell and an estimate (for example, a filtered value). A graph 1220 shows a comparison between a real value of a battery pack having a 1S2P structure and an estimate, and a graph 1230 shows a comparison between a real value of a battery pack having a 1S3P structure and an estimate. A graph 1240 shows a comparison between a real value of a battery pack having a 1S4P structure and an estimate, and a graph 1250 shows a comparison between a real value of a battery pack having a 1S5P structure and an estimate. A graph 1260 shows a comparison between a real value of a battery pack having a 1S6P structure and an estimate, and a graph 1270 shows a comparison between a real value of a battery pack having a 1S7P structure and an estimate.

In each of the graphs 1210 through 1270, an x axis represents a number of cycles of a battery pack or a battery cell, and a y axis represents an SOH as a battery life. A single cycle is a cycle in which power of a fully charged battery is completely discharged.

In addition, in each of the graphs 1210 through 1270, the real value represents an actual life of a corresponding battery. A filtered value is a value acquired by repeating a preset number of times a process by which a battery state estimation apparatus estimates a plurality of module states by applying a plurality of neural networks to a single piece of cell data and excludes (for example, filters out) a module state beyond a predetermined range around a median value for the estimated module states from the estimated module states.

An error between the real value and a pack state (for example, the above-described filtered value) estimated by the battery state estimation apparatus is relatively small as shown in the graphs 1210 through 1270, and thus it is possible to achieve a high accuracy in the battery state estimation.

The battery state estimation apparatus 120, the sensor 240, the data receiver 310, the processor 320, the memory 430, the simplifier 821, the battery degradation model 831, the neural network 920, the preprocessor 1121, the simplifier 1122, the module state estimator 1123, the pack state estimator 1124, the battery degradation model 1130, and the data transmitter 1140 in FIGS. 1-4, 8, 9, and 11 that perform the operations described herein with respect to FIGS. 1-11. are implemented by hardware components. Examples of hardware components include controllers, sensors, generators, drivers, memories, comparators, arithmetic logic units, adders, subtractors, multipliers, dividers, integrators, and any other electronic components known to one of ordinary skill in the art. In one example, the hardware components are implemented by computing hardware, for example, by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1-11. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 6-8 and 10 that perform the operations described herein with respect to FIGS. 1-11 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus for estimating a pack state of a battery pack, the apparatus comprising:
   a data receiver configured to receive, from a first battery module included in the battery pack and comprising battery cells connected in parallel with each other, first module data associated with the first battery module; and
   a processor configured to
      calculate, from the first module data, first cell data of a first battery cell of the battery cells of the first battery module based on a number of the battery cells connected in parallel with each other;
      convert the first battery module to a first virtual cell by scaling, based on the first cell data, the first module data to data of a first single battery cell to generate first virtual cell data of the first virtual cell;
      input, to a battery degradation model modeling degradation of the single battery cell through machine learning, the first virtual cell data;
      output, from the battery degradation model, a first module state of the first battery module; and
      determine, based on the output first module state, the pack state of the battery pack.

2. The apparatus of claim 1, wherein processor is further configured to:
   calculate, based on the output first module state, a first statistical value of the first module state; and
   determine the pack state based on the first statistical value.

3. The apparatus of claim 1, further comprising a data transmitter configured to transmit either one or both of the first module state and the pack state to an external device.

4. The apparatus of claim 1, wherein:
   the first module data comprises a value of a voltage signal output from the first battery module, a value of a current signal output from the first battery module, and a value of a temperature signal output from the first battery module; and
   the scaling of the first module data to the data of the first single battery cell comprises calculating the data of the first single battery cell by assigning, as the data of the first single battery cell, the value of the voltage signal, the value of the temperature signal, and a current value calculated by dividing the value of the current signal by the number of the battery cells connected in parallel.

5. The apparatus of claim 1, further comprising a preprocessor configured to preprocess the received first module data, and provide the preprocessed first module data to the processor.

6. The apparatus of claim 1, wherein the first module data comprises any one or any combination of any two or more of a voltage signal output from the first battery module, a current signal output from the first battery module, and a temperature signal output from the first battery module.

7. The apparatus of claim 1, wherein the processor is further configured to estimate a battery life of the battery pack based on the output first module state, and to determine an amount of charge of the battery pack based on the estimated battery life.

8. The apparatus of claim 1, wherein the battery pack comprises a plurality of battery modules connected in series with each other; and
   each of the plurality of battery modules comprises a respective plurality of battery cells connected in parallel with each other.

9. The apparatus of claim 1, wherein the battery degradation model comprises a data-driven model comprising a neural network, or an equivalent circuit model expressing a relationship between the cell data and the pack state.

10. The apparatus of claim 1, wherein the battery degradation model is a machine learning model comprising a neural network.

11. The apparatus of claim 10, wherein the neural network is trained using a plurality of pattern profiles determined from simulations of a battery.

12. The apparatus of claim 1, wherein the battery pack further comprises a second battery module connected in series to the first battery module, and wherein the processor is further configured to:
   receive, from the second battery module, second module data associated with the second battery module; and
   calculate, from the second module data, second cell data of a second battery cell of a plurality of battery cells of the second battery module;
   convert the second battery module to a second virtual cell by scaling, based on the second cell data, the second module data to data of a second single battery cell to generate second virtual cell data of the second virtual cell;
   input, to the battery degradation model, the second virtual cell data;
   output, from the battery degradation model, a second module state of the second battery module; and
   determine, based on the first module state and the output second module state, the pack state of the battery pack.

13. The apparatus of claim 12, wherein the pack state of the battery pack comprises one of a minimum of the first module state and the second module state, a maximum of the first module state and the second module state, or a median of the first module state and the second module state.

14. The apparatus of claim 13, wherein the battery pack is mounted in an electric vehicle (EV); and
the processor is further configured to select the minimum of the first module state and the second module state, and determine the pack state based on the minimum.

15. A method of estimating a pack state of a battery pack, the method comprising:
receiving, from a first battery module included in the battery pack and comprising battery cells connected in parallel with each other, first module data;
calculating, from the first module data, first cell data of a first battery cell of the battery cells of the first battery module based on a number of the battery cells connected in parallel with each other;
converting the first battery module to a first virtual cell by scaling, based on the first cell data, the first module data to data of a first single battery cell to generate first virtual cell data of the first virtual cell;
inputting, to a battery degradation model modeling degradation of the single battery cell through machine learning, the scaled first virtual cell data;
outputting, from the battery degradation model, a first module state of the first battery module; and
determining, based on the output first module state, the pack state of the battery pack.

16. The method of claim 15, wherein the determining of the pack state comprises:
calculating, based on the output first module state, a first statistical value of the first module state; and
determining the pack state based on the first statistical value.

17. A non-transitory computer-readable storage medium storing instructions to cause computing hardware to perform the method of claim 15.

18. An apparatus for estimating a pack state of a battery pack having an nSmP structure, n and m being integers equal to or greater than "1," the apparatus comprising:
a data receiver configured to receive respective module data from each of a plurality of battery modules in the battery pack, wherein each battery module of the plurality of battery modules comprises respective battery cells connected in parallel with each other and has a 1SmP structure; and
a processor configured to
calculate, for each battery module, respective cell data corresponding to each of the respective battery cells of each battery module based on the respective module data and a number of the respective battery cells connected in parallel with each other;
convert each battery module to a respective virtual cell by scaling, based on the respective cell data of the battery module, the respective module data of each battery module to data of a respective single battery cell to generate respective virtual cell data of the respective virtual cell;
input, to a battery degradation model modeling degradation of the respective single battery cells through machine learning, the respective scaled first virtual cell data;
output, from the battery degradation model, a respective module state of each battery module; and
estimate, based on the respective output module state of each battery module, the pack state of the battery pack.

19. The apparatus of claim 18, wherein each of the battery modules comprises a number m of respective battery cells connected in parallel with each other; and
the processor is further configured to the respective cell data of each battery module by converting the respective module data of each battery module to the respective cell data based on the number m of the battery cells connected in parallel with each other.

* * * * *